(12) United States Patent
Kim (10) Patent No.: US 10,199,437 B2
(45) Date of Patent: Feb. 5, 2019

(54) ORGANIC LIGHT EMITTING DIODE DISPLAY

(75) Inventor: Gun-Shik Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

(21) Appl. No.: 13/469,036

(22) Filed: May 10, 2012

(65) Prior Publication Data

US 2013/0057521 A1    Mar. 7, 2013

(30) Foreign Application Priority Data

Sep. 5, 2011    (KR) .................. 10-2011-0089793

(51) Int. Cl.
*H01L 27/32*    (2006.01)
*G09G 3/3225*    (2016.01)

(52) U.S. Cl.
CPC ....... *H01L 27/3216* (2013.01); *G09G 3/3225* (2013.01); *H01L 27/3218* (2013.01); *G09G 2300/0452* (2013.01); *G09G 2300/0465* (2013.01)

(58) Field of Classification Search
CPC ... G09G 3/36; G06G 3/32; H04N 7/01; G02F 1/136
USPC ............ 345/76, 204, 694, 613, 88; 313/504; 348/458; 349/109
See application file for complete search history.

(56) References Cited

U.S. PATENT DOCUMENTS 5,504,504 A * 4/1996 Markandey ........ G02B 26/0841
345/214
5,899,550 A * 5/1999 Masaki .................. 349/109
6,750,875 B1 * 6/2004 Keely et al. .................. 345/613
7,492,337 B2 * 2/2009 Fukase ............................ 345/76
2004/0212633 A1 * 10/2004 Natori ...................... G09F 9/33
345/694
2005/0099540 A1 * 5/2005 Elliott .................. G06T 3/4023
348/458

(Continued)

FOREIGN PATENT DOCUMENTS

KR    10-0748807    8/2007
KR    10-0885842    2/2009

(Continued)

OTHER PUBLICATIONS

Korean Patent Abstracts, Publication No. 1020060120451 A dated Nov. 27, 2006, for corresponding Korean Patent 10-0748807.

(Continued)

*Primary Examiner* — Chad M Dicke
(74) *Attorney, Agent, or Firm* — Lewis Roca Rothgerger Christie LLP (57) ABSTRACT

An organic light emitting diode (OLED) display includes first pixels, second pixels, and third pixels. The OLED display includes a first column including a plurality of the first pixels alternately arranged with a plurality of the second pixels; and a second column adjacent to the first column and comprising a plurality of the third pixels. One of the first pixels and one of the second pixels in the first column correspond to more than two of the third pixels in the second column. Rendering driving is applied such that high resolution of more than 350 pixels per inch (PPI) may be realized without deterioration of the image quality while the total number of pixels is smaller than in a pentile matrix arrangement.

12 Claims, 12 Drawing Sheets

(56) References Cited

U.S. PATENT DOCUMENTS

| | | | |
|---|---|---|---|
| 2006/0132668 A1* | 6/2006 | Park ..................... | G09G 3/3233 349/48 |
| 2007/0002084 A1* | 1/2007 | Kimura et al. ............... | 345/694 |
| 2008/0084376 A1* | 4/2008 | Hirota .................. | G09G 3/3607 345/88 |
| 2009/0322215 A1* | 12/2009 | Sung et al. ................... | 313/504 |
| 2011/0291549 A1* | 12/2011 | Kim et al. .................... | 313/504 |

FOREIGN PATENT DOCUMENTS

| | | |
|---|---|---|
| KR | 10-2010-0051019 | 5/2010 |
| KR | 10-2011-0026786 | 3/2011 |

OTHER PUBLICATIONS

Korean Patent Abstracts, Publication No. 1020040013794 A dated Feb. 14, 2004, for corresponding Korean Patent 10-0885842.

\* cited by examiner

ORGANIC LIGHT EMITTING DIODE DISPLAY

CROSS-REFERENCE TO RELATED APPLICATION

This application claims priority to and the benefit of Korean Patent Application No. 10-2011-0089793, filed in the Korean Intellectual Property Office on Sep. 5, 2011, the entire content of which is incorporated herein by reference.

BACKGROUND

1. Field

Aspects of embodiments of the present invention relate generally to an organic light emitting diode (OLED) display.

2. Description of Related Art

An organic light emitting diode (OLED) display includes organic light emitting elements formed of a hole injection electrode, an organic emission layer, and an electron injection electrode. With the OLED display, electrons and holes are combined with each other in the organic emission layer to thereby generate excitons. When the excitons shift from an excited state to a ground state, energy is released to emit light, and images are displayed based on the emitted light.

An OLED display is a flat panel display that can be made lightweight and thin because it has a self-luminous characteristic and requires no separate light source. Particularly, the OLED display exhibits quality characteristics such as low power consumption, high luminance, and high response speed, and as such, the OLED display receives much attention as a next-generation display device.

The OLED display may form a plurality of unit pixels by using red pixels, green pixels, and blue pixels, thereby displaying various color images. The red pixels, the green pixels, and the blue pixels may be arranged in various ways.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention provide for an organic light emitting diode (OLED) display improving a life span while realizing a high aperture ratio and a high resolution.

In an exemplary embodiment according to the present invention, an organic light emitting diode (OLED) display is provided. The OLED display includes first pixels, second pixels, and third pixels. The OLED display further includes a first column including a plurality of the first pixels alternately arranged with a plurality of the second pixels, and a second column adjacent to the first column and including a plurality of the third pixels. One of the first pixels and one of the second pixels in the first column correspond to more than two of the third pixels in the second column.

A sum of a first column direction length of one of the first pixels and a second column direction length of one of the second pixels may be a same as a sum of third column direction lengths of each of the more than two of the third pixels.

The first column direction length of the one of the first pixels and the second column direction length of the one of the second pixels may be a same.

The more than two of the third pixels may include between three and five of the third pixels.

The OLED display may further include a third column adjacent to the second column and including a plurality of the first pixels alternately arranged with a plurality of the second pixels, wherein the first pixels and the second pixels in the third column are alternately arranged with respect to the first pixels and the second pixels in the first column.

A first pixel column pair (including the first column and the second column), and a second pixel column pair (including the third column and a fourth column adjacent to the third column and including a plurality of the third pixels), may be alternately arranged in a row direction.

The first pixels in the first column and the first pixels in the third column may correspond in a diagonal direction with respect to the third pixels in the second column.

The second pixels in the first column and the second pixels in the third column may correspond in a diagonal direction with respect to the third pixels in the second column.

The first pixels may be alternately arranged with respect to the second pixels in both the row and column directions.

The first pixels, the second pixels, and the third pixels may be configured to display different colors.

The first pixels, the second pixels, and the third pixels may include red pixels, blue pixels, and green pixels, respectively.

The first pixels, the second pixels, and the third pixels may be configured to be driven by rendering driving.

An area of the one of the first pixels and an area of the one of the second pixels may be a same.

An area of the one of the second pixels and an area of one of the third pixels may be different.

The OLED display according to an exemplary embodiment includes one first pixel and one second pixel disposed in the first column and corresponding to a plurality of third pixels disposed in the second column. In the OLED display, rendering driving is applied such that high resolution of more than 350 pixels per inch (PPI) may be realized without deterioration of the image quality while the total number of pixels is smaller than in comparable structures.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Throughout the specification, when a first element is referred to as being "coupled to" a second element, the first element may be directly coupled (e.g., connected) to the second element, or indirectly coupled (e.g., electrically connected) to the second element via one or more third elements.

An organic light emitting diode (OLED) display may use a plurality of red pixels, green pixels, and blue pixels to display various color images. The red pixels, the green pixels, and the blue pixels may be arranged in various ways, such as in a stripe type. The stripe type is a shape in which pixels having the same color are arranged in a column unit. In an OLED display, an organic emission layer of each pixel may be formed by a deposition process using a fine metal mask (FMM) such that a blocking layer corresponding to an interval of the fine metal mask exists between the pixels.

Accordingly, in order to increase the resolution of an OLED display in a stripe type arrangement, the OLED display includes many blocking layers formed between the pixels, such that the aperture ratio of the pixels is deteriorated. As a minimum interval for forming an opening of the fine metal mask is limited, it may be difficult to manufacture an OLED display having the pixel arrangement of the stripe type with high resolution.

One way to address this is a pixel arrangement that is referred to as the "Pentile Matrix Color Pixel Arrangement," provided by Clairvoyante Laboratories Inc. In the pentile matrix structure, the red pixels and the blue pixels are alternately arranged in the same column, and the green pixels are arranged in the neighboring column. The pentile matrix arrangement may reduce the number of red pixels and blue pixels by half and the total number of pixels by one-third compared with the stripe type such that the same reorganization resolution (e.g., effective resolution) as the stripe type may be realized through, for example, rendering driving while simultaneously obtaining a high aperture ratio.

However, in the case of the pentile matrix structure, the minimum interval forming the opening of the fine metal mask is limited such that it is difficult to realize high resolution of more than 350 pixels per inch (PPI).

What follows are OLED displays according to exemplary embodiments of the present invention that include first pixels and second pixels in the first column, each first pixel and second pixel in the first column together corresponding to a plurality of third pixels in the second column. In these embodiments, rendering driving is applied such that high resolution of more than 350 PPI may be realized without deterioration of the image quality while the total number of pixels is smaller than in the pentile matrix arrangement.

Figure 1:
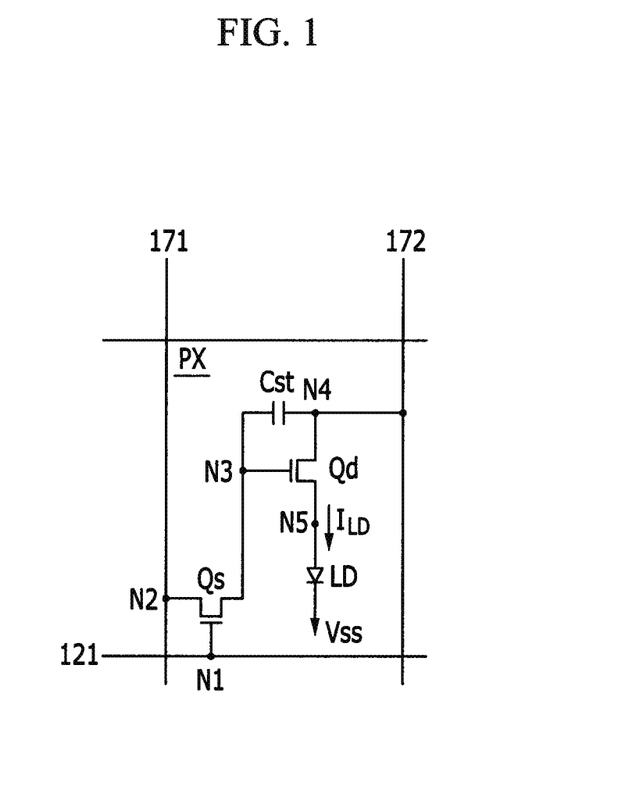
FIG. 1 is an equivalent circuit of one pixel of an organic light emitting diode (OLED) display according to a first exemplary embodiment.

FIG. 1 is an equivalent circuit of one pixel of an organic light emitting diode (OLED) display according to a first exemplary embodiment.

Referring to FIG. 1, an organic light emitting device includes a plurality of signal lines 121, 171, and 172, and a pixel PX coupled thereto. The pixel PX may be, for example, one of a red pixel R, a green pixel G, or a blue pixel B.

The signal lines include a plurality of scan signal lines (or scan lines or gate lines) 121 for transmitting gate signals (or scanning signals), a plurality of data lines 171 for transmitting data signals, and a plurality of driving voltage lines 172 for transmitting a driving voltage. The scan lines 121 extend substantially in a row direction and substantially parallel to each other, and the data lines 171 extend substantially in a column direction and substantially parallel to each other. The driving voltage lines 172 extend substantially in a column direction and substantially parallel to each other, however, in other embodiments they may extend, for example, in the row direction or the column direction, or in a mesh shape.

One pixel PX includes a switching transistor Qs, a driving transistor Qd, a capacitor Cst, and an organic light emitting element LD. The switching transistor Qs has a control terminal coupled to one of the scan lines 121 at a first node N1, an input terminal coupled to one of the data lines 171 at a second node N2, and an output terminal coupled to the driving transistor Qd at a third node N3. The switching transistor Qs transmits the data signals applied to the data line 171 to the driving transistor Qd in response to a gate signal applied to a gate line 121.

The driving transistor Qd has a control terminal coupled to the switching transistor Qs at the third node N3, an input terminal coupled to the driving voltage line 172 at a fourth node N4, and an output terminal coupled to the organic light emitting element LD at a fifth node N5. The driving transistor Qd drives an output current $I_{LD}$ having a magnitude depending on the voltage between the control terminal and the output terminal thereof.

The capacitor Cst is coupled between the control terminal and the input terminal of the driving transistor Qd, that is, between the third node N3 and the fourth node N4. The capacitor Cst stores a data signal applied to the control terminal of the driving transistor Qd and maintains the data signal after the switching transistor Qs turns off.

The organic light emitting element LD may, for example, be an organic light emitting diode (OLED) having an anode coupled to the output terminal of the driving transistor Qd and a cathode coupled to a common voltage Vss. The organic light emitting element LD emits light having an intensity depending on an output current $I_{LD}$ of the driving transistor Qd, thereby displaying images in combination with other organic light emitting elements. The organic light emitting element LD may include an organic material uniquely emitting at least one of three primary colors of, for example, red, green, or blue. In addition, the organic light emitting device emits light of desired images by a spatial sum of several such organic light emitting elements thereof.

In the embodiment of FIG. 1, the switching transistor Qs and the driving transistor Qd are shown as n-channel field effect transistors (FETs), however, in other embodiments, at least one may be a p-channel FET. In addition, the connections among the transistors Qs and Qd, the capacitor Cst, and the organic light emitting diode LD may be modified in other embodiments.

A structure of the OLED display according to the embodiment of FIG. 1 will now be described with reference to FIG. 2 and FIG. 3 as well as FIG. 1.

Figure 2:
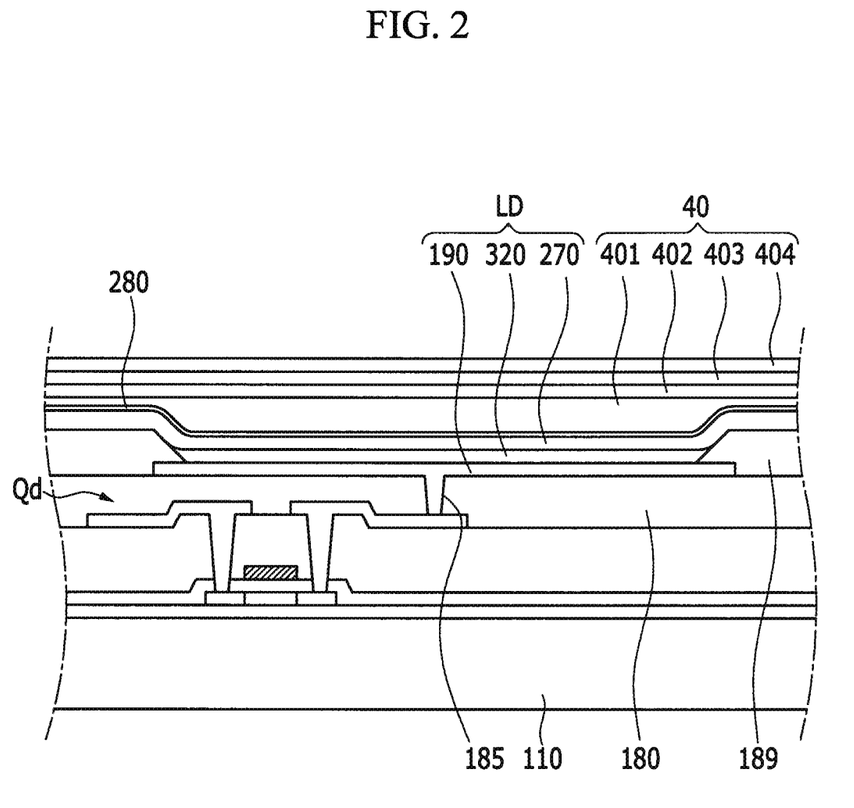
FIG. 2 is a cross-sectional view of an OLED display according to the embodiment of FIG. 1.

FIG. 2 is a cross-sectional view of an OLED display according to the embodiment of FIG. 1.

As shown in FIG. 2, a driving transistor Qd is formed on an insulated substrate 110 made of, for example, transparent glass or plastic. In addition, a plurality of signal lines (not shown) and a plurality of switching transistors (not shown) may be further formed on the insulated substrate 110.

A passivation layer 180 made of an inorganic material or an organic material is formed on the driving transistors Qd. When the passivation layer 180 is made of an organic material, the surface thereof may be flat. The passivation layer 180 has a contact hole 185 exposing a portion of the driving transistor Qd. A pixel electrode 190 is formed on the passivation layer 180. The pixel electrode 190 may include a reflective electrode and/or a transparent electrode formed thereon. The reflective electrode may be made of a metal having high reflectance such as silver (Ag) or aluminum (Al), or alloys thereof, and the transparent electrode may be made of a transparent conductive oxide such as ITO (indium tin oxide) or IZO (indium zinc oxide).

A pixel defining layer 189 covering the edge circumference of the pixel electrode 190 is formed on the passivation layer 180. An organic emission layer 320 is formed on the pixel electrode 190, and a common electrode 270 is formed on the organic emission layer 320 and the pixel defining layer 189.

The organic emission layer 320 may further include (1) an emission layer (not shown) where light is substantially emitted, and (2) organic layers (not shown) for efficient transmission of carriers of holes or electrons to an emission layer. The organic layers may include a hole injection layer (HIL) and a hole transport layer (HTL) disposed (e.g., located) between the pixel electrode 190 and the emission layer, and an electron injection layer (EIL) and an electron transport layer (ETL) disposed between the common electrode 270 and the emission layer.

An overcoat 280 covering and protecting the common electrode 270 and that may be made of the organic layer may be formed on the common electrode 270. A thin film encapsulation layer 40 is formed on the overcoat 280. The thin film encapsulation layer 40 is formed on the organic light emitting element LD and a driving circuit to seal the organic light emitting element LD and the driving circuit from the external environment for protection. The thin film encapsulation layer 40 includes, for example, organic encapsulation layers 401 and 403 and inorganic encapsulation layers 402 and 404. The organic encapsulation layers 401 and 403 and the inorganic encapsulation layers 402 and 404 are alternately layered. In FIG. 3, for example, two organic encapsulation layers 401 and 403 and two inorganic encapsulation layers 402 and 404 are alternately deposited one by one to form the thin film encapsulation layer 40, however the present invention is not limited thereto.

An arrangement of a plurality of pixels of the OLED display according to the embodiment of FIGS. 1-2 will be described with reference to FIG. 3.

Figure 3:
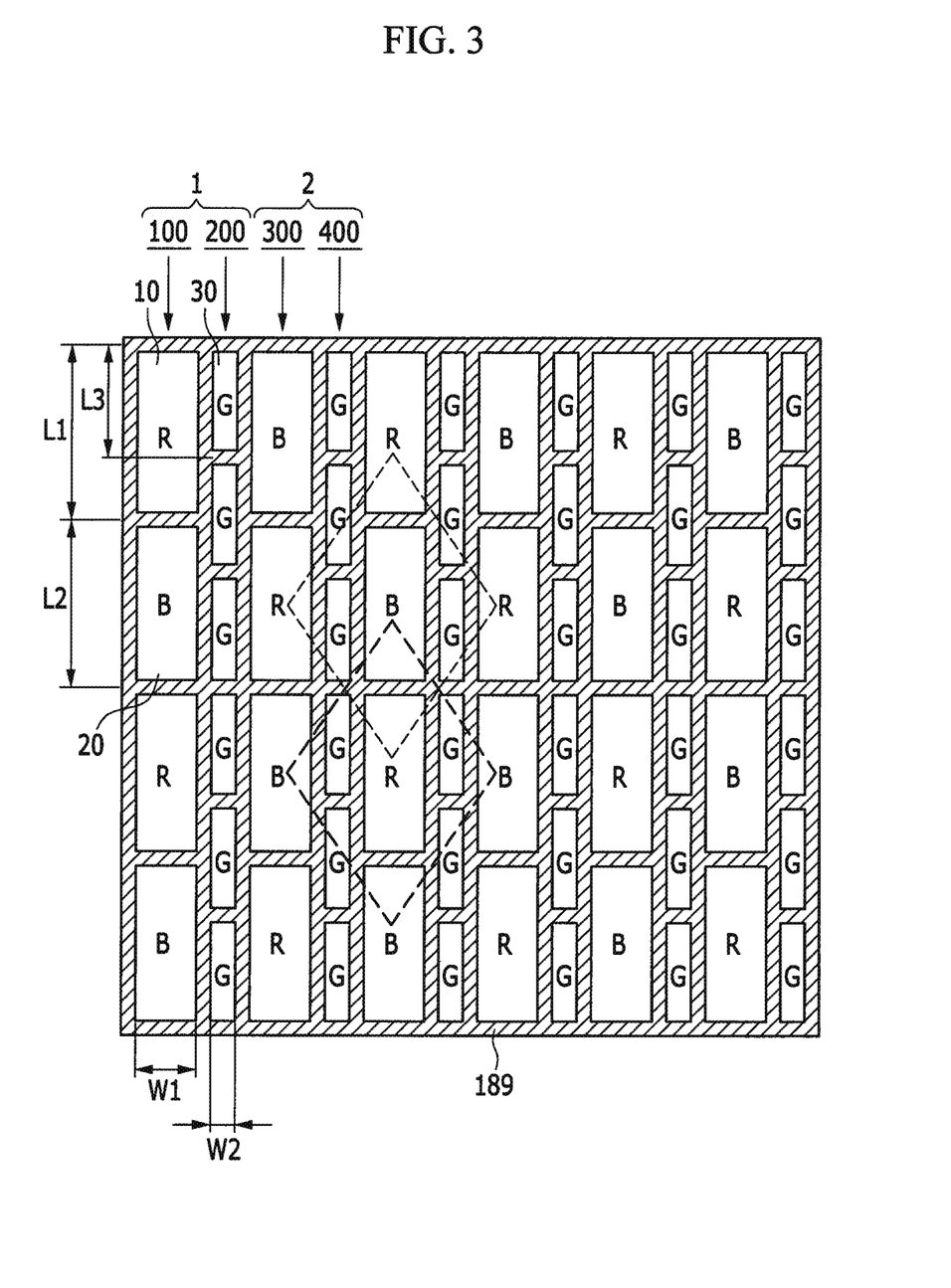
FIG. 3 is a top plan view of an arrangement of a plurality of pixels of an OLED display according to the embodiment of FIGS. 1-2.

FIG. 3 is a top plan view of an arrangement of a plurality of pixels of an OLED display according to the embodiment of FIGS. 1-2.

As shown in FIG. 3, the OLED display includes a first pixel 10, a second pixel 20, and a third pixel 30 displaying different colors and having a rectangular shape. The first pixel 10 emits a first color light, the second pixel 20 emits a second color light, and the third pixel 30 emits a third color light. The first color, the second color, and the third color may, for example, respectively be red, blue, and green. That is, the first pixel 10 may be a red pixel R, the second pixel 20 may be a blue pixel B, and the third pixel 30 may be a green pixel G. However, the present invention is not limited thereto, and in other embodiments the first pixel 10 or the second pixel 20 may be a green pixel G.

The first pixel 10, the second pixel 20, and the third pixel 30 are repeatedly arranged with a uniform pattern (such as a predetermined uniform pattern or a predetermined uniform two-dimensional pattern), and the pixel defining layer 189 is between the pixels to divide the pixels. That is, the first pixel 10 and the second pixel 20 are alternately disposed in a first column 100, and the third pixel 30 is disposed in a second column 200 close to the first column 100 in which the first pixel 10 and the second pixel 20 are disposed.

The first pixel column 100 and the second pixel column 200 are disposed as (e.g., make up) a first pixel column pair 1. A second pixel column pair 2 including a third column 300 in which the second pixel 20 (e.g., the blue pixel B) and the first pixel 10 (e.g., the red pixel R) are alternately disposed and a fourth column 400 in which the third pixel 30 is disposed beside the first pixel column pair 1 including the first column 100 and the second column 200. The first pixel column pair 1 and the second pixel column pair 2 are alternately arranged in the row direction. Here, in the first column 100, the first pixel 10 and the second pixel 20 are sequentially disposed, and in the third column 300, the second pixel 20 and the first pixel 10 are sequentially disposed, that is, alternately arranged with respect to the first column 100.

An arrangement of a plurality of pixels of the OLED display according to the embodiment of FIGS. 1-3 will be described with reference to the drawings.

As shown in FIG. 3, one first pixel 10 and one second pixel 20 disposed in the first column 100 are disposed to correspond to a plurality of the third pixels 30 disposed in the second column 200. That is, a sum of a first column direction length L1 of one first pixel 10 and a second column direction length L2 of one second pixel 20 is the same as the sum of third column direction lengths L3 of each of a plurality (in this case, three) of the third pixels 30. The sum of the first column direction length L1 of the first pixel 10 and the second column direction length L2 of the second pixel 20 may, for example, be the same as the sum of the third column direction lengths L3 of each of three to five third pixels 30. In other embodiments, the sum of the first column direction length L1 of the first pixel 10 and the second column direction length L2 of the second pixel 20 may be the same as the sum of the third column direction lengths L3 of each of any number, greater than two, of third pixels 30 (such as two-and-a-half third pixels 30 or six third pixels 30).

In the OLED display of FIG. 3, the sum of the first column direction length L1 of the first pixel 10 and the second column direction length L2 of the second pixel 20 is the same as the sum of the third column direction lengths L3 of each of three third pixels 30 and will now be described in further detail.

The first column direction length L1 of the first pixel 10 and the second column direction length L2 of the second pixel 20 are equal to each other, and the third column direction length L3 of the third pixel 30 is smaller than the first column direction length L1 of the first pixel 10. The present invention is not limited thereto. For example, in other embodiments, the first column direction length L1 of the first pixel 10 may be different from the second column direction length L2 of the second pixel 20.

The first pixel 10 disposed in the first column 100 and the first pixel 10 disposed in the third column 300 near the second column 200 are disposed in a diagonal direction with respect to the third pixel 30 disposed in the second column 200. In addition, the second pixel 20 disposed in the first column 100 and the second pixel 20 disposed in the third column 300 are disposed in a diagonal direction with respect to the third pixel 30 disposed in the second column 200.

For example, the red pixel R disposed in the first column 100 and the red pixel R disposed in the third column 300 are disposed in a diagonal direction with respect to the green pixel G disposed in the second column 200. In addition, the blue pixel B disposed in the first column 100 and the blue pixel B disposed in the third column 300 are disposed in a diagonal direction with respect to the green pixel G of the second column 200. In addition, as illustrated in FIG. 3, four first pixels 10 close to the second pixel 20 enclose the second pixel 20 with a rhombus shape, and four second pixels 20 close to the first pixel 10 enclose the first pixel 10 with a rhombus shape. Accordingly, the same number of third pixels 30 is formed as in the pixel arrangement of the stripe type with the same resolution, but one-third the number of first pixels 10 and second pixels 20 is formed compared with the pixel arrangement of the stripe type. Consequently, the total number of pixels is five-ninths compared with the pixel arrangement of the stripe type, such that the total number of pixels is smaller than in the pentile matrix arrangement having two-thirds the number of pixels compared with the pixel arrangement of the stripe type. As such, the aperture ratio of the embodiment of FIG. 3 is improved compared to that of the pentile matrix arrangement.

A driving method of the OLED display according to the embodiment of FIGS. 1-3 having the above pixel arrangement will now be described with reference to FIG. 4 to FIG. 7.

FIG. 4 to FIG. 7 are views of a driving method of an OLED display according to the embodiment of FIGS. 1-3.

The OLED display is driven with a rendering driving method. The rendering driving method is a technique for driving specific pixels of a stripe type arrangement, only for pixel arrangements where, for example, pixels of two colors share a column instead of having dedicated columns. The rendering driving method is a method in which two or more surrounding pixels near a specific pixel are driven to create the visual effect that the specific pixel is driven as well. Thus, a specific image intended to be displayed in a stripe type arrangement of pixels may be naturally displayed when driving pixels arranged in, for example, the pixel arrangement of FIGS. 3-7.

A method of applying the rendering driving method to the OLED display according to the embodiment of FIGS. 1-7 will now be described in more detail. In the method, reference is made to driving a stripe type arrangement, that is, one green pixel G and a corresponding blue pixel B and red pixel R, only using the pixel arrangement of FIGS. 3-7. For ease of description, the three pixels are assumed to be driven to the same luminance.

Figure 4:
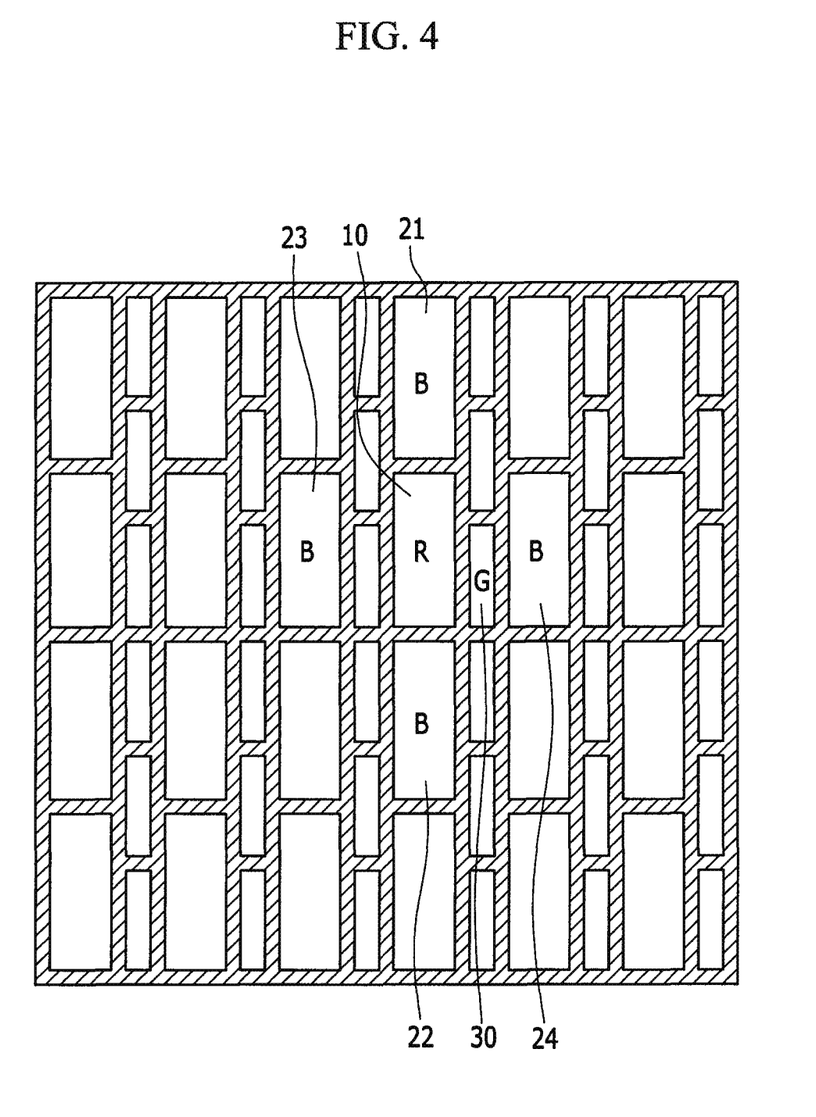
FIG. 4 to FIG. 7 are views of a driving method of an OLED display according to the embodiment of FIGS. 1-3.

First, as shown in FIG. 4, when there is no blue pixel B close to (i.e., in the same pixel row as) the green pixel (G) 30 and disposed in the same pixel column pair (i.e., the pixel column including the green pixel 30, and the pixel column to the left including the red pixel 10), then (1) the green pixel (G) 30 is driven with the same method as the stripe type, (2) the red pixel (R) 10 disposed in the same pixel column pair as the green pixel (G) 30 and close to the green pixel (G) 30 is driven with the same luminance as the green pixel (G) 30 to display red, and (3) the four blue pixels (B) 21, 22, 23, and 24 enclosing the red pixel (R) 10 with the rhombus shape are driven to display blue.

Figure 5:
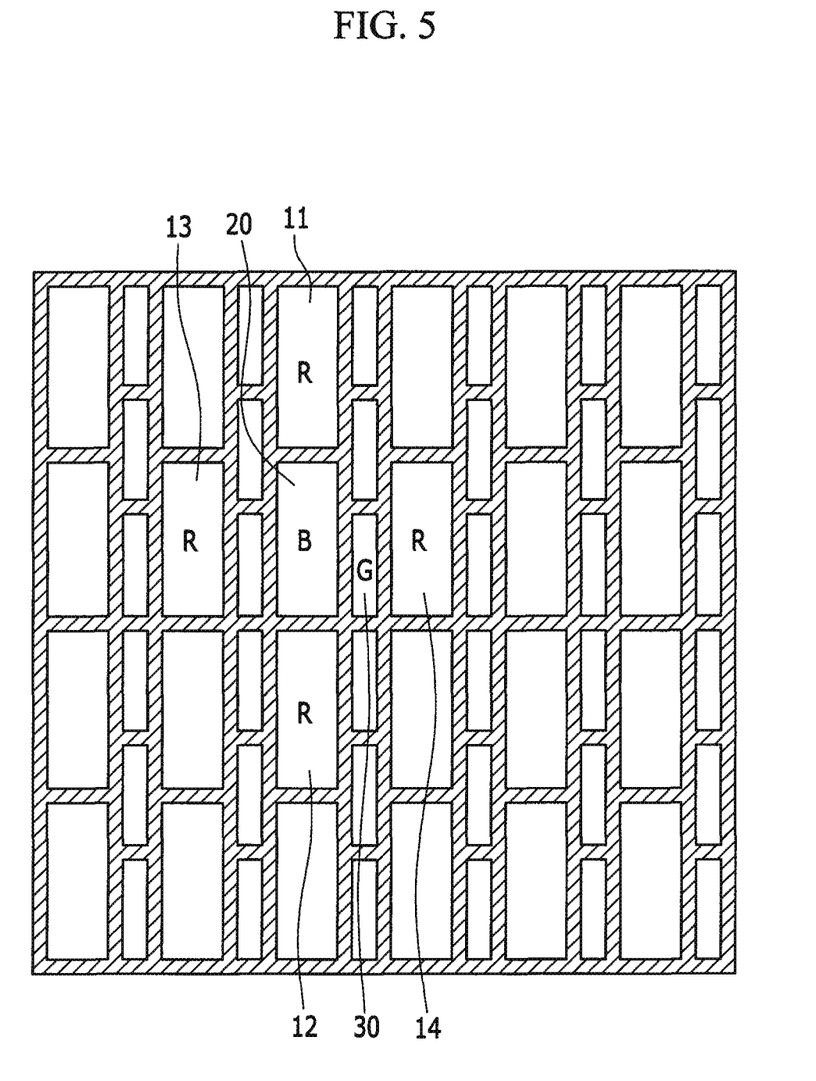

Next, as shown in FIG. 5, when there is no red pixel R close to the green pixel (G) 30 and disposed in the same pixel column pair, then (1) the green pixel (G) 30 is driven with the same method as the stripe type, (2) the blue pixel (B) 20 disposed in the same pixel column pair as the green pixel (G) 30 and close to the green pixel (G) 30 is driven with the same luminance as the green pixel (G) 30 to display blue, and (3) the four red pixels (R) 11, 12, 13, and 14 enclosing the blue pixel (B) 20 with the rhombus shape are driven to display red.

Figure 6:
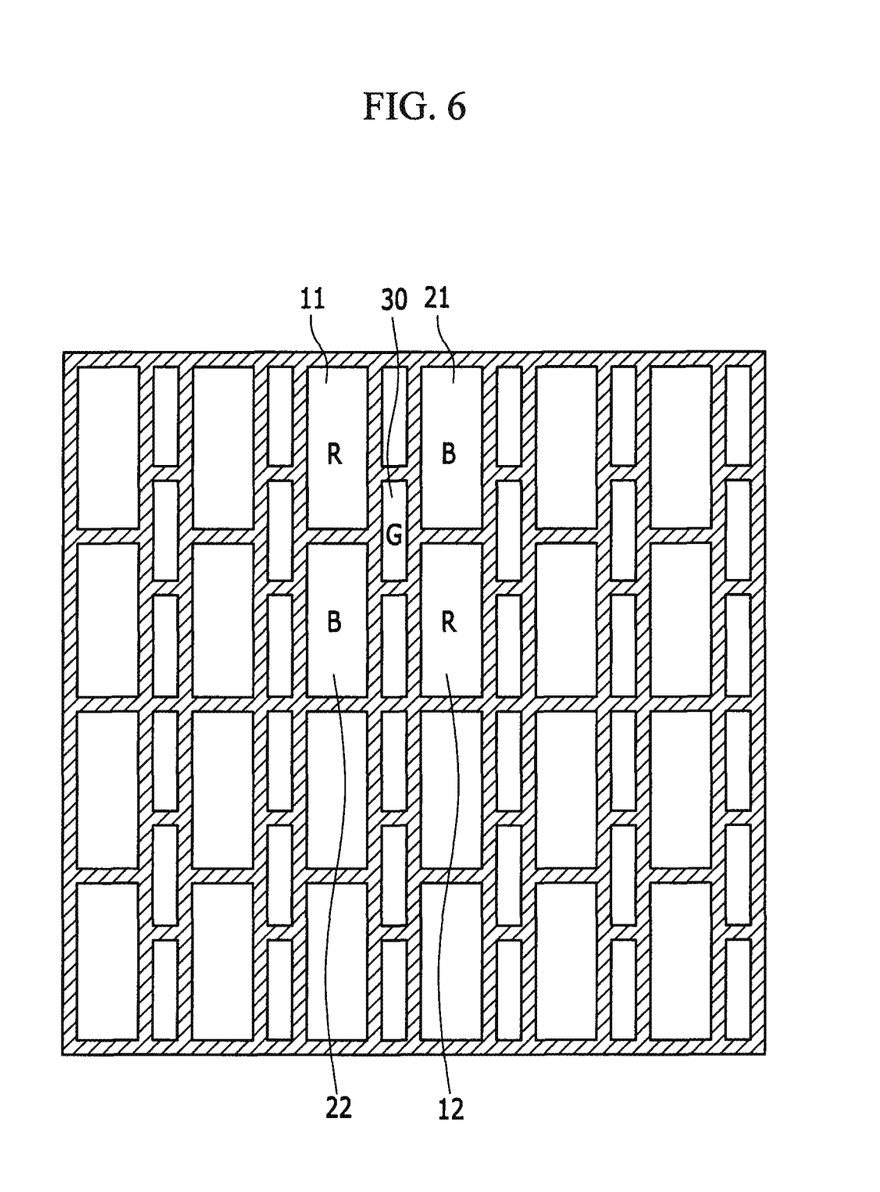
Figure 7:
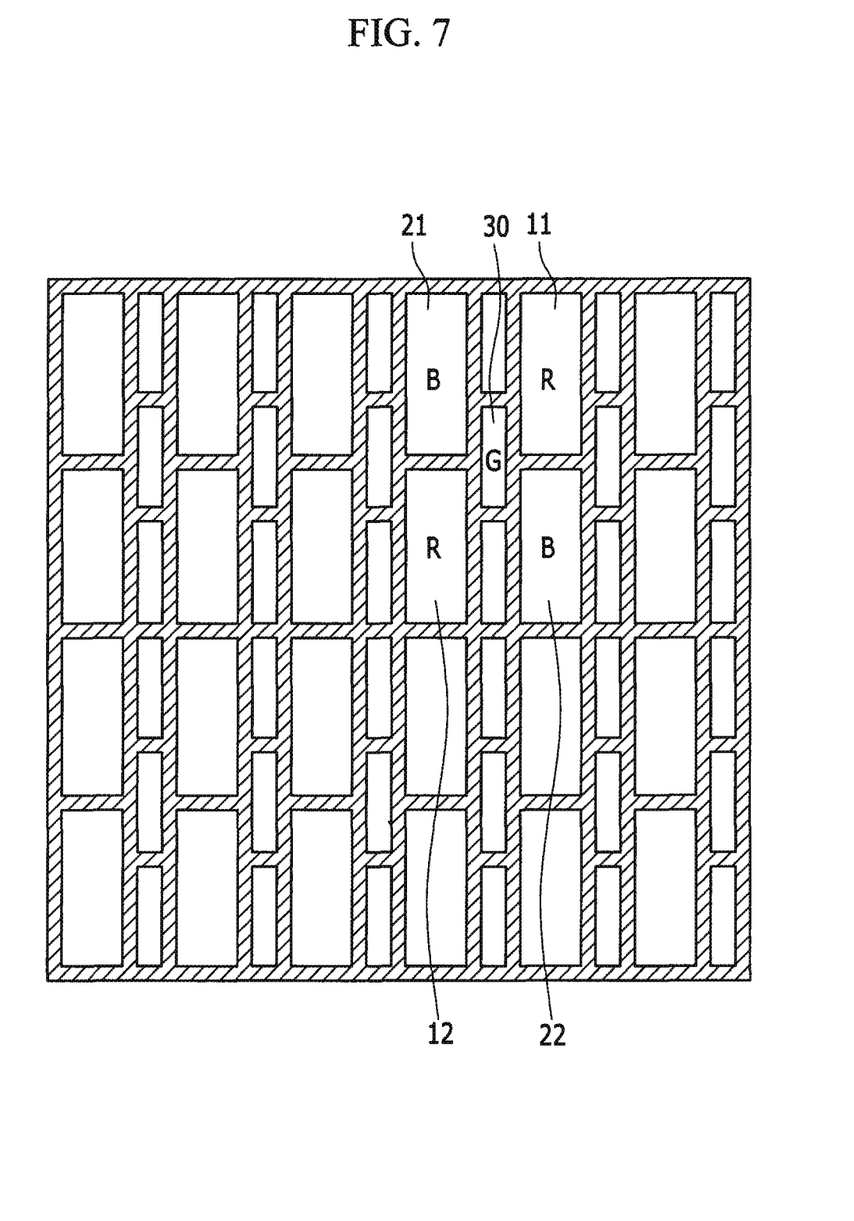

Next, as shown in FIG. 6 and FIG. 7, when there is no red pixel R or blue pixel B close to (i.e., in the same pixel row as) the green pixel (G) 30 and disposed in the same pixel column pair, two red pixels (R) 11 and 12 and two blue pixels (B) 21 and 22 disposed in the diagonal direction are driven to respectively display the red and blue. It should be noted that in FIG. 6 and FIG. 7, the red pixels (R) 11 and 12, and the blue pixels (B) 22 and 21, respectively, are only partially in the same pixel row as the green pixel (G) 30, which is different from the situation in FIGS. 4-5.

The OLED display having the above pixel arrangement according to the embodiment of FIGS. 1-7 is driven by using the above rendering driving method. A method of dividing luminance for every pixel or an image processing method may be added to the rendering driving method. For example, as described above and illustrated in FIGS. 4-7, four separate pixels can each be driven to one-fourth the luminance, or two separate pixels can each be driven to one-half the luminance, when rendering a specific pixel that does not appear in the pixel arrangement of FIGS. 3-7.

As described above, one first pixel 10 disposed in the first column 100 and one second pixel 20 disposed in the second column 200 are disposed to face three third pixels 30. In addition, the rendering driving is applied such that high resolution of more than 350 PPI without deterioration of image quality may be realized while reducing the total number of pixels compared with the pentile matrix arrangement.

Further, as the light emitting area of the pixel is increased under the same luminance, that is, as the aperture ratio is increased, the current density flowing to the pixel is decreased, such that the deterioration degree of the element is reduced. As a result, the aperture ratio of the pixel and the life span of the OLED display are proportionally increased.

Figure 8:
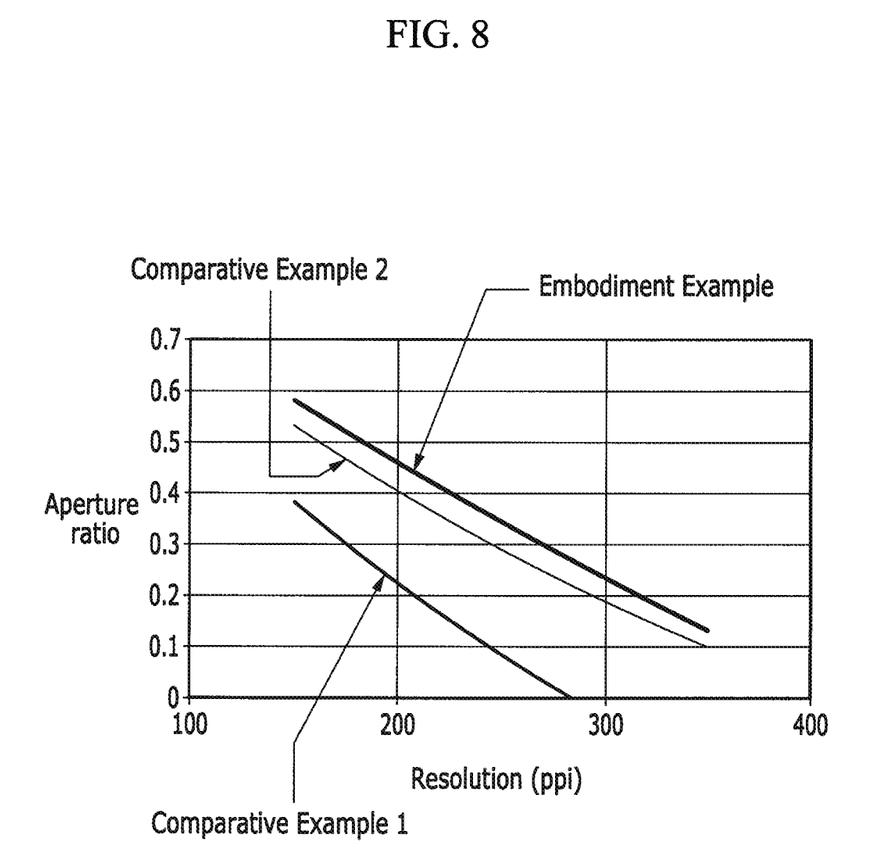
FIG. 8 is a graph showing a relation of an aperture ratio according to resolution of an OLED display according to the embodiment of FIGS. 1-7 and Comparative Examples 1 and 2.

FIG. 8 is a graph showing a relation of an aperture ratio according to resolution of an OLED display according to the embodiment of FIGS. 1-7 and Comparative Examples 1 and 2.

Comparative Example 1 is an OLED display of the pixel arrangement of the stripe type, and Comparative Example 2 is an OLED display of the pentile matrix arrangement. As shown in FIG. 8, in the case of Comparative Example 1 (stripe type), the aperture ratio is zero for resolutions of 300 PPI, or even a little less than 300 PPI, and the aperture ratio of the present exemplary embodiment is widened significantly (e.g., 40%) compared with those of Comparative Examples 1 and 2. Accordingly, the present exemplary embodiment improves the aperture ratio such that the life span is improved compared with Comparative Examples 1 and 2.

In addition, the area of one first pixel 10 and the area of one second pixel 20 may be equal to each other, while the area of the second pixel 20 and the area of the third pixel 30 may be different from each other. In particular, the area of the second pixel 20 may be larger than the area of the third pixel 30. The life span of the blue organic emission layer formed in the blue pixel B of the second pixel 20 is relatively short when compared to that of the green pixel G, such that the blue pixel B may be formed to be wider than the green pixel G of the third pixel 30. It should be noted that in other embodiments, the area of one first pixel 10 and the area of one second pixel 20 may be different from each other.

Further, the number of first pixels 10 is one-third the number of third pixels 30 and the number of second pixels 20 is one-third the number of third pixels 30, such that a large number of third pixels 30 are set as the green pixels (G) that are sensitive to color, thereby displaying an image of high quality.

The embodiment of FIGS. 1-7 may not be distinguishable from the pixel arrangement of the stripe type when considering the reorganization from the rendering technique described above. In addition, as shown in FIG. 8, the embodiment of FIGS. 1-7 can achieve resolutions of more than 350 PPI, and may be realized in OLED displays, for example, with resolutions of more than 300 PPI (that is, resolutions not achievable with the stripe type arrangement).

In the embodiment of FIGS. 1-7, the sum of the first column direction length of the first pixel and the second column direction length of the second pixel is the sum of the third column direction lengths of each of three third pixels for the pixel arrangement. In other embodiments, however, the sum of the first column direction length of the first pixel and the second column direction length of the second pixel may be the same as the sum of the third column direction lengths of each of four or five third pixels to form the pixel arrangement.

Figure 9:
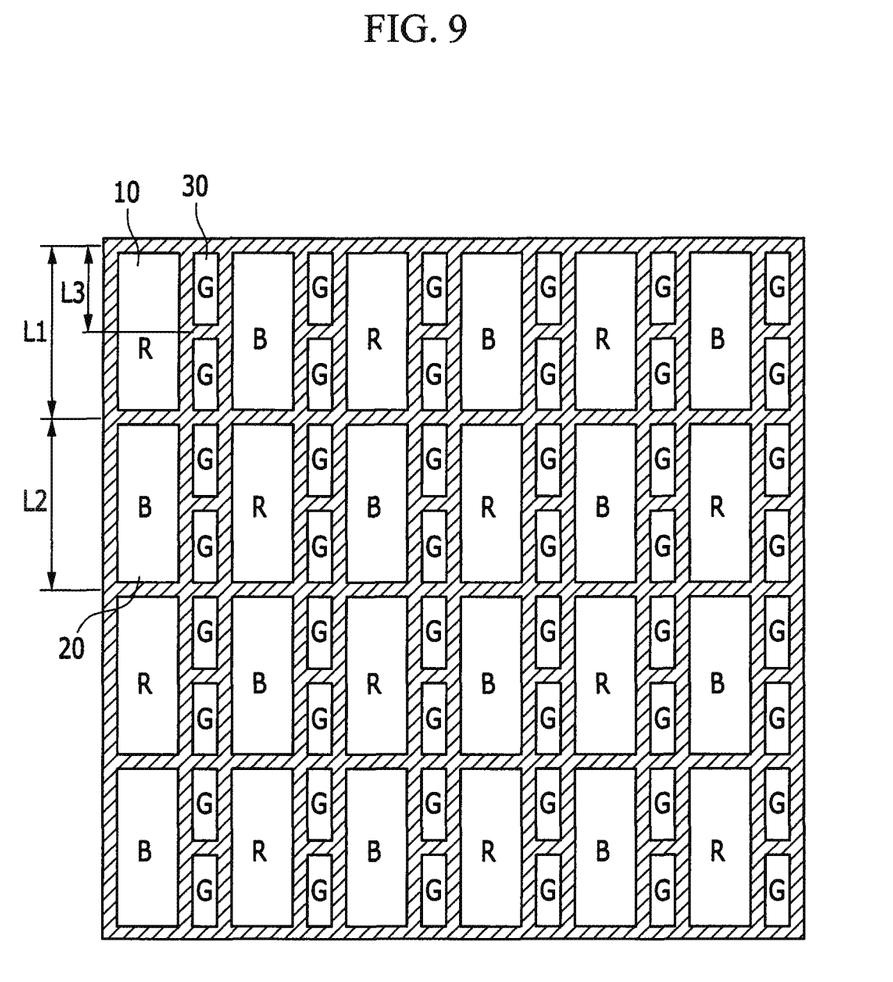
FIG. 9 is a top plan view of an arrangement of a plurality of pixels of an OLED display according to a second exemplary embodiment.
Figure 10:
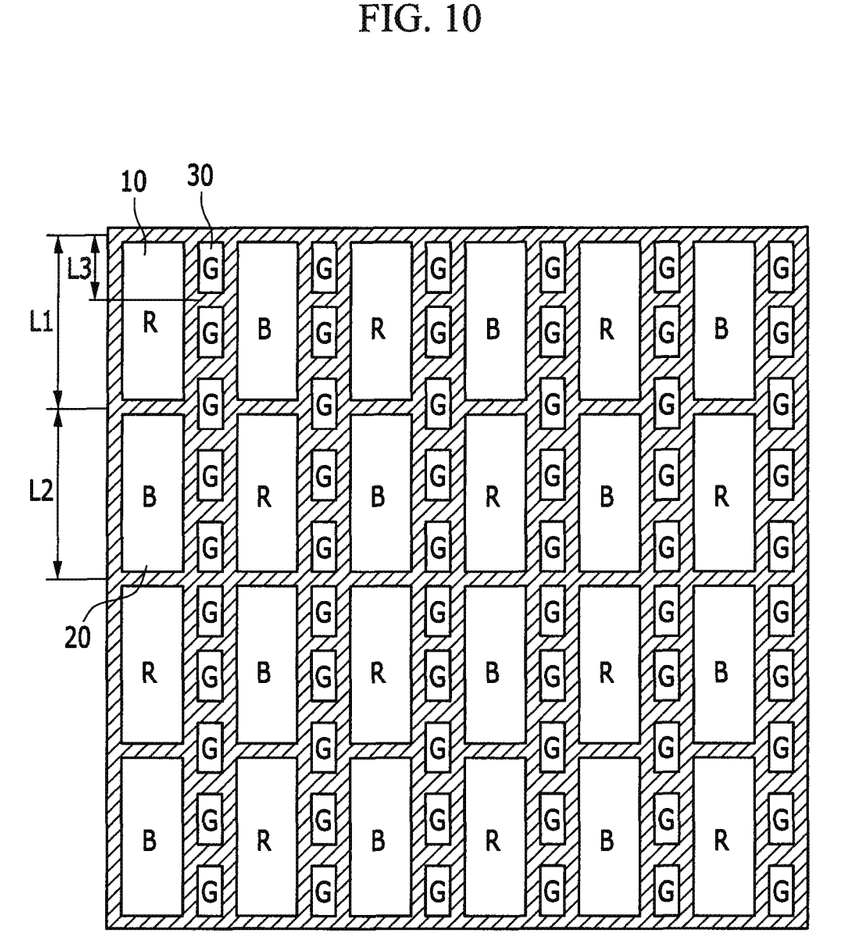
FIG. 10 is a top plan view of an arrangement of a plurality of pixels of an OLED display according to a third exemplary embodiment.

FIG. 9 is a top plan view of an arrangement of a plurality of pixels of an OLED display according to a second exemplary embodiment. FIG. 10 is a top plan view of an arrangement of a plurality of pixels of an OLED display according to a third exemplary embodiment.

The embodiments shown in FIG. 9 and FIG. 10 are substantially equivalent to the embodiment shown in FIG. 3 except for the number of third pixels corresponding to the first pixel and the second pixel.

As shown in FIG. 9, the sum of first column direction length L1 of the first pixel 10 and the second column direction length L2 of the second pixel 20 are the same as the sum of the third column direction lengths L3 of each of four third pixels 30. Here, the first column direction length L1 of the first pixel 10 is the same as the second column direction length L2 of the second pixel 20, and the third column direction length L3 of the third pixel 30 is smaller than the first column direction length L1 of the first pixel 10. Also, four first pixels 10 close to the second pixel 20 enclose the second pixel 20 with the rhombus shape, and four second pixels 20 close to the first pixel 10 enclose the first pixel 10 with the rhombus shape (as illustrated in FIG. 3).

Accordingly, the same number of third pixels 30 is formed as in the pixel arrangement of the stripe type of the same resolution, and one-quarter the number of first pixels 10 and second pixels 20 is formed compared with the pixel arrangement of the stripe type. Consequently, the total number of pixels is half compared with the pixel arrangement of the stripe type, such that the total number pixels is smaller than the pentile matrix arrangement that is two-thirds compared with the stripe type pixel arrangement. As a result, the aperture ratio is improved and the life span is improved.

In addition, as shown in FIG. 10, the sum of the first column direction length L1 of the first pixel 10 and the second column direction length L2 of the second pixel 20 is the same as the sum of the third column direction lengths L3 of each of five third pixels 30. The first column direction length L1 of the first pixel 10 and the second column direction length L2 of the second pixel 20 are the same, and the third column direction length L3 of the third pixel 30 is smaller than the first column direction length L1 of the first pixel 10. Also, four first pixels 10 close to the second pixel 20 enclose the second pixel 20 with the rhombus shape, and four second pixels 20 close to the first pixel 10 enclose the first pixel 10 with the rhombus shape (as illustrated in FIG. 3).

Accordingly, the same number of third pixels 30 is formed as the number of the pixel arrangement of the stripe type with the same resolution, and the number of first pixels 10 and second pixels 20 is one-fifth compared with the pixel arrangement of the stripe type. Consequently, the total number of pixels is seven-fifteenths compared with the pixel arrangement of the stripe type, such that the total number pixels is smaller than the pentile matrix arrangement that is two-thirds compared with the pixel arrangement of the stripe type. As a result, the aperture ratio is improved and the life span is improved.

As described above, one first pixel 10 and one second pixel 20 of the first column 100 are disposed to correspond to four or five third pixels 30 of the second column 200, and the rendering driving is applied such that a high resolution of more than 350 PPI may be realized without deterioration of the image quality while the total number of pixels is less than in the pentile matrix arrangement.

In the embodiment of FIGS. 1-7, the first to third pixels are rectangular. In other embodiments, the first to third pixels may be other shapes, such as circular or polygonal.

Figure 11:
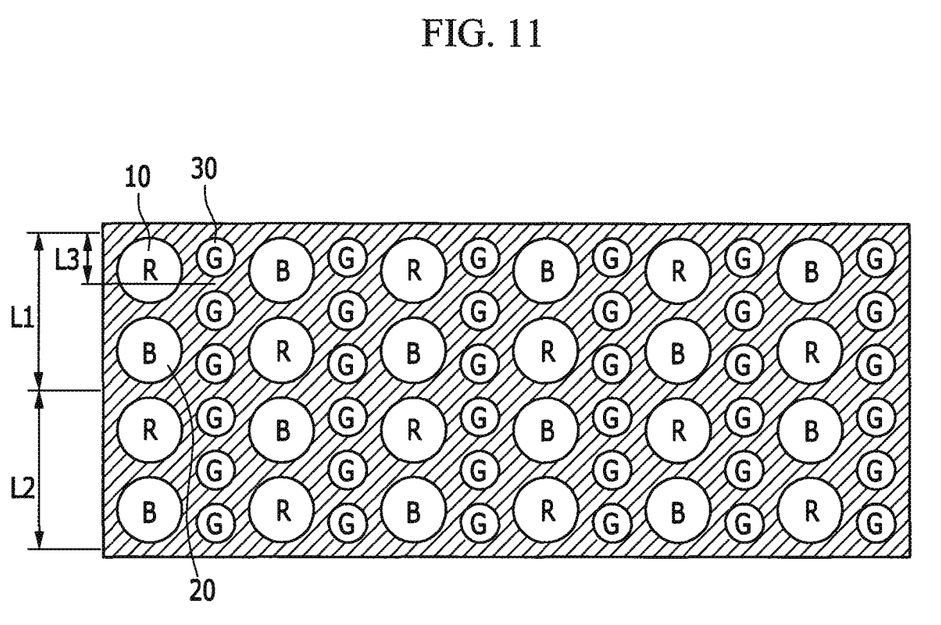
FIG. 11 is a top plan view of an arrangement of a plurality of pixels of an OLED display according to a fourth exemplary embodiment.
Figure 12:
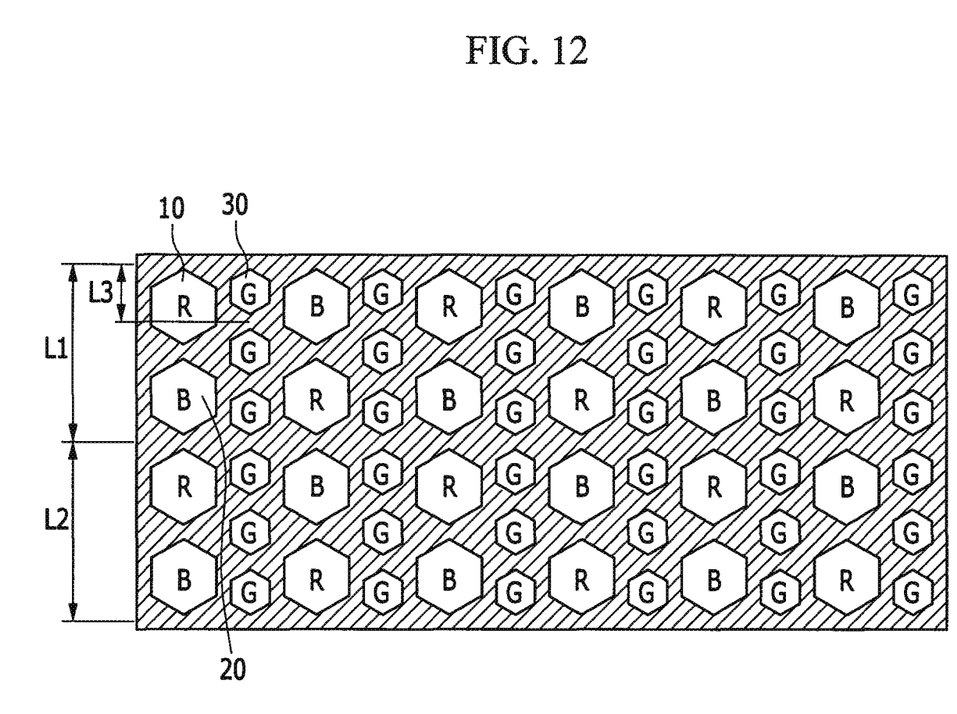
FIG. 12 is a top plan view of an arrangement of a plurality of pixels of an OLED display according to a fifth exemplary embodiment.

FIG. 11 is a top plan view of an arrangement of a plurality of pixels of an OLED display according to a fourth exemplary embodiment. FIG. 12 is a top plan view of an arrangement of a plurality of pixels of an OLED display according to a fifth exemplary embodiment.

The embodiments shown in FIG. 11 and FIG. 12 are substantially equivalent to the embodiment shown in FIG. 3, except for the shape of the first to third pixels. Accordingly, repeated description may not be provided.

As shown in FIG. 11, the OLED display includes the first pixel 10, the second pixel 20, and the third pixel 30 having a circular shape displaying different colors. The sum of the first column direction length L1 of the first pixel 10 and the second column direction length L2 of the second pixel 20 is the same as the sum of the third column direction lengths L3 of each of three third pixels 30. At this time, the first column direction length L1 of the first pixel 10 and the second column direction length L2 of the second pixel 20 are the same, and the third column direction length L3 of the third pixel 30 is smaller than the first column direction length L1 of the first pixel 10. In addition, four first pixels 10 close to the second pixel 20 enclose the second pixel 20 with the rhombus shape, and four second pixels 20 close to the first pixel 10 enclose the first pixel 10 with the rhombus shape (similar to the illustration shown in FIG. 3).

Further, as shown in FIG. 12, the OLED display includes the first pixel 10, the second pixel 20, and the third pixel 30 having a hexagonal shape displaying different colors. The sum of the first column direction length L1 of the first pixel 10 and the second column direction length L2 of the second pixel 20 is the same as the sum of the third column direction lengths L3 of each of three third pixels 30. At this time, the first column direction length L1 of the first pixel 10 and the second column direction length L2 of the second pixel 20 are the same, and the third column direction length L3 of the third pixel 30 is smaller than the first column direction length L1 of the first pixel 10. In addition, four first pixels 10 close to the second pixel 20 enclose the second pixel 20 with the rhombus shape, and four second pixels 20 close to the first pixel 10 enclose the first pixel 10 with the rhombus shape (as similarly illustrated in FIG. 3).

As described above, one first pixel 10 and one second pixel 20 of the first column 100 are disposed to correspond to three third pixels of the second column 200, and the rendering driving is applied such that the high resolution of more than 350 PPI may be realized without deterioration of the image quality, while the total number of pixels is smaller than in the pentile matrix arrangement.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

| Description of Some of the Symbols | |
|---|---|
| 10: first pixel | 20: second pixel |
| 30: third pixel | 190: pixel electrode |
| 270: common electrode | 320: organic emission layer |
| 40: thin film encapsulation layer | 189: pixel defining layer |

What is claimed is:

1. An organic light emitting diode (OLED) display comprising:
 a matrix of pixels aligned in both row and column directions, each of the pixels comprising subpixels from among a group of subpixels comprising:
  a first column comprising one first subpixel and one second subpixel, each of the first subpixel and the second subpixel having a first end and a second end spaced from the first end in the column direction; and
  a second column comprising three to five third subpixels, each of the third pixels having a first end and a second end spaced from the first end in the column direction, all of the third subpixels having a same color, the second column being immediately adjacent to the first column at one side of the first column,
 wherein the first end of the one first subpixel is directly aligned in the row direction with the first end of a first one in the column direction of the three to five third subpixels, and the second end of the one second subpixel is directly aligned in the row direction with the second end of a last one in the column direction of the three to five third subpixels, and
 wherein one of the first subpixels is at a center of four nearest ones of the second subpixels located at respective vertices of a rhombus shape and one of the second subpixels is at a center of four nearest ones of the first subpixels located at respective vertices of a rhombus shape, and
 wherein said one of the first subpixels and said one of the second subpixels is each configured to constitute three or more pixels, each of the three or more pixels comprising a corresponding one of the third subpixels on the second column that is immediately adjacent to the first column at the one side of the first column, and each of the third subpixels is configured to constitute only one pixel.

2. The OLED display of claim 1,
 wherein the group of subpixels further comprises a third column comprising another second subpixel and another first subpixel,
 wherein the second and first subpixels in the third column are alternately arranged with respect to the first and second subpixels in the first column.

3. The OLED display of claim 2, wherein the group of subpixels further comprises a fourth column comprising another three to five third subpixels of the same color.

4. The OLED display of claim 2, wherein
 the first subpixels are diagonally arranged, and
 the second subpixels are diagonally arranged.

5. The OLED display of claim 2, wherein the first subpixels are alternately arranged with respect to the second subpixels in both the row and column directions.

6. The OLED display of claim 1, wherein the one first subpixel, the one second subpixel, and one of the three to five third subpixels are configured to display different colors.

7. The OLED display of claim 6, wherein the one first subpixel, the one second subpixel, and the one of the three to five third subpixels comprise a red subpixel, a blue subpixel, and a green subpixel, respectively.

8. The OLED display of claim 1, wherein the one first subpixel has the same area as the one second subpixel.

9. The OLED display of claim 8, wherein the one second subpixel has a different area than one of the three to five third subpixels.

10. The OLED display of claim 1, wherein the one first subpixel on the first column and a first one of the three to five third subpixels on the second column are driven to act as a first pixel of the pixels by partially illuminating the one second subpixel on the first column and another second subpixel on a nearby one of columns.

11. The OLED display of claim 10, wherein the one second subpixel and a second one of the three to five third subpixels are driven to act as a second pixel of the pixels by partially illuminating the one first subpixel on the first column and another first subpixel on the nearby one of the columns.

12. The OLED display of claim 11, wherein a third one of the three to five third subpixels is driven to act as a third pixel of the pixels by partially illuminating the one first subpixel on the first column and another first subpixel on the nearby one of the columns and partially illuminating another second subpixel on the first column and said another second subpixel on the nearby one of the columns.

* * * * *